United States Patent [19]

Ferri

[11] 4,326,180

[45] Apr. 20, 1982

[54] MICROWAVE BACKDIODE MICROCIRCUITS AND METHOD OF MAKING

[75] Inventor: Romano I. Ferri, Westport, Conn.

[73] Assignee: Microphase Corporation, Cos Cob, Conn.

[21] Appl. No.: 91,521

[22] Filed: Nov. 5, 1979

[51] Int. Cl.³ .................. H01P 3/08; H01P 11/00; H01L 23/50; H01L 21/461

[52] U.S. Cl. .................. 333/246; 29/574; 29/577 C; 333/247; 357/51

[58] Field of Search ............... 333/246–247; 357/12, 51, 74, 75; 29/569 R, 574, 576 C, 577 R, 577 C

[56] References Cited

U.S. PATENT DOCUMENTS

| | | | |
|---|---|---|---|
| 3,099,776 | 7/1963 | Henneke | 357/61 |
| 3,150,021 | 9/1964 | Sato | 357/12 X |
| 3,293,092 | 12/1966 | Gunn | 29/576 R |
| 3,343,107 | 9/1967 | Golightly | 333/247 |
| 3,421,985 | 1/1969 | Baker et al. | 204/15 |
| 3,669,773 | 6/1972 | Levi | 29/578 X |
| 3,900,353 | 8/1975 | Marriott et al. | 252/79.4 X |
| 3,951,707 | 4/1976 | Kurtz et al. | 29/25.35 X |
| 4,026,659 | 5/1977 | McBride et al. | 156/632 X |

Primary Examiner—Marvin L. Nussbaum
Attorney, Agent, or Firm—Parmelee, Johnson, Bollinger & Bramblett

[57] ABSTRACT

After a circuit is completely configured, including the mounting of semiconducting material onto a conductive layer and the connection of a conductor lead from a dot on the semiconducting material to the circuit, the required backdiode e/i characteristic is obtained by subjecting the whole circuit assembly to etching processing. The entire circuit is immersed into an electrolytic solution for etching away the semiconducting material to form the fragile narrow neck of the backdiode, thereby obtaining the required backdiode characteristic while advantageously obtaining an irreducible minimum of parasitic reactances associated with the resultant backdiode. Subsequent handling of the fragile backdiode as a component has been avoided because it is advantageously fabricated "in situ" pre-joined and integrated with the other components of the desired electronic circuit.

10 Claims, 7 Drawing Figures

MICROWAVE BACKDIODE MICROCIRCUITS AND METHOD OF MAKING

BACKGROUND OF THE INVENTION

This invention relates to microwave backdetector microcircuits and more particularly to a method of making a wideband microcircuit having a fragile backdiode therein. Tunnel diodes and backdiodes (a generic variation) are a special class of metal-semiconductor junction devices used in microwave circuits as detectors in wideband frequency band applications.

For many years it has been known that the operating characteristics of a tunnel diode can be precisely controlled by etching away the semiconductor material. A disclosure of such a method of forming a tunnel diode is shown in U.S. Pat. No. 3,150,021 to Akihiko Sato. As noted in that patent, a tunnel diode is mounted to a jig and immersed in an etching solution to etch the semiconductor material surrounding the connecting lead. Subsequently, the tunnel diode is removed from the jig member and is encapsulated for use in a circuit. As shown in FIG. 7 of U.S. Pat. No. 3,669,773 to Levi, a mesa type diode may be mounted on a conductive base. An insulating tube supporting a conductive ring surrounds the mesa diode. A gold ribbon is connected to the mesa diode and to the conductive ring. A conductive cap hermetically seals the mesa diode. This encapsulated diode can then be used in a suitable circuit.

Backdiodes have a very fragile neck. Conventionally, back diodes are packaged into a variety of "microwave packages," and are sealed to protect the fragile construction of the finished diode element. These packages are then incorporated into RF circuits and structures, as discrete components. These backdiodes, in the conventional encased or packaged form, present a number of performance limitations caused by degradation of the high frequency performance due to their residual and inherent parasitic reactances. In the prior art, there are frequency limitations that are severe in nature when attempts have been made to build a microwave limiter backdetector circuit or other microwave circuits utilizing a backdiode, because of the residual and inherent parasitic reactances associated with the required conventional package.

This invention provides, for the first time, a method of integrating backdiodes in RF and microwave circuits while advantageously drastically reducing or eliminating the troublesome residual reactances introduced by standard backdiode packages.

As an example of the frequency limitations in prior art backdetector circuits, it is noted that prior art limiter backdetector circuits are generally operable over a frequency coverage of not much more than one octave and are increasingly difficult to operate about 10 gigaHertz.

SUMMARY OF THE INVENTION

An object of this invention is to provide "in situ" fabrication of diodes, pre-joined and integrated with other components of a desired electronic circuit. The method provided by this invention completely eliminates physical handling of a finished diode as a separate circuit element and, because of its intimate construction into the electronic circuit as a whole, circumvents the undesirable stray reactances normally associated with conventional diode packages.

The invention concerns itself with the method of processing a "raw" diode chip in its place of usage while simultaneously connected to its adjacent circuit components.

The means of attaching, bonding, soldering or otherwise securing the "raw" diode chip and other components to the circuit and techniques of interconnection, and the etchant for semiconductor material are known per se in the prior art.

An object of this invention is to provide a microwave backdiode microcircuit having wide bandwidth capabilities at extremely high frequencies, for example, from approximately 2 to 18 gigaHertz, and sometimes even up to 26 gigaHertz.

Another object of this invention is to provide a method of manufacturing a backdiode microcircuit in which the fragile etched diode is at all times electrically connected with lead(s) secured thereto.

A further object of this invention is to provide a means of fabricating microwave circuits utilizing backdiodes as integral parts of these circuits without the undesirable parasitic effects of prior art backdiode packaging.

In accordance with the invention in one of its aspects, a semiconductor element is mounted to a conductive base and a lead is secured to a dot on the upper surface of the semiconductor element and is connected into a circuit assembly. Only after the "raw" semiconductor element has been thus assembled and connected in a circuit is the semiconductor etched to form the fragile neck of the backdiode.

In accordance with the invention in another of its aspects, a semiconductor element, positioned and electrically connected within a circuit assembly is processed in situ by subjecting the whole circuit assembly to an etching treatment while all of the remaining circuit components (except for the semiconductor element) are resistant to such etching treatment. Consequently, the region of the semiconductor material surrounding the dot at which the lead is secured is etched away to form the backdiode in the already preassembled circuit.

In accordance with the invention in another of its aspects, a microwave backdetector microcircuit includes a strip transmission line, a backdiode and a capacitor in series. A diode assembly is mounted to either the strip transmission line or the capacitor depending upon the output polarity desired, and the semiconductor element together with the whole circuit assembly is subsequently immersed into an etching solution to form the backdiode.

Advantageously, a microwave backdetector is provided by this invention having a very wide band of frequency coverage in reception at extremely high frequencies. The illustrative embodiments of the invention provide a microwave backdetector circuit having a bandwidth coverage which extends over a range greater than three octaves at extremely high frequencies, for example, from approximately 2 to 18 gigaHertz, and sometimes even up to 26 gigaHertz. This same wide bandwidth of coverage can be achieved when the circuit is arranged to include a limiter diode in the input for providing a microwave limiter backdetector circuit.

DESCRIPTION OF THE PREFERRED EMBODIMENTS

The invention is primarily applicable to, but not limited to, use in very high RF and microwave frequencies, where its chief advantage of eliminating residual reactances serves the purpose of improved electrical performance. At these frequencies, the most desirable transmission line media are miniature strip lines and high permittivity dielectric, micro-strip lines. Therefore, the preferred embodiment is the construction of the backdiode on, or in conjunction with the micro-strip line of certain characteristic impedance and electrical length. This combined embodiment or, "detector microcircuit" may be extended into other embodiments to include one or more lumped or distributed circuit elements to form a variety of different circuits, that can be further integrated in larger scales or can be sealed in modular forms for discrete applications.

BRIEF DESCRIPTION OF THE DRAWINGS

The foregoing and other objects, features and advantages of the invention will become more fully understood from the following detailed description of preferred embodiments of the invention, as illustrated in the accompanying drawings in which like reference numbers refer to like parts throughout the different views. The drawings are not necessarily to scale, emphasis instead being placed upon illustrating the principles of the invention.

DETAILED DESCRIPTION

Figure 1:
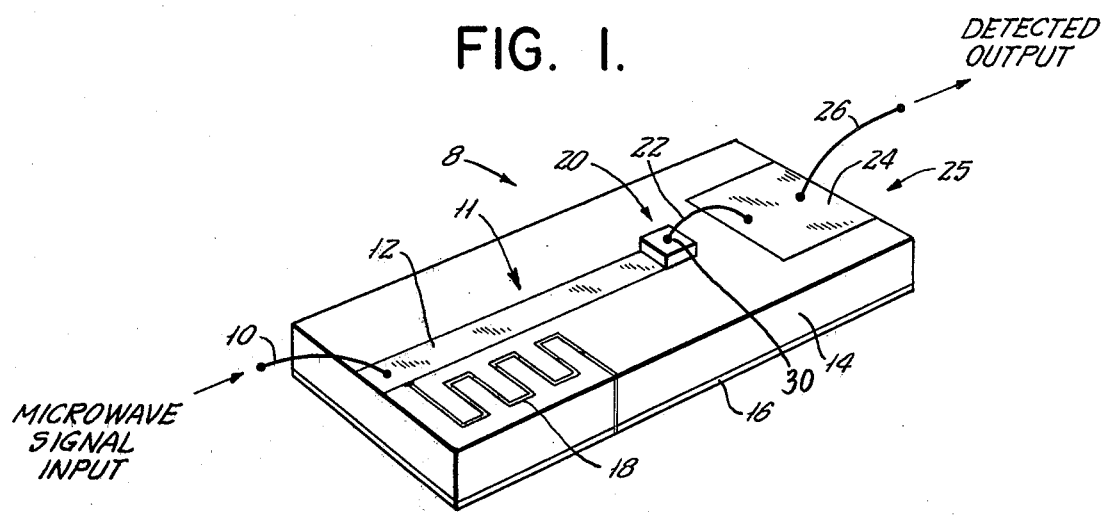
FIG. 1 is a perspective view of a backdetector integrated circuit including a backdiode formed in accordance with the method of the present invention.

A negative output backdetector circuit for providing envelope detection of an amplitude modulated microwave radio signal is shown at 8 in FIG. 1. A microwave input signal to be detected is fed into input lead 10 which is preferred to be gold from a microwave source which may, for example, be a coaxial cable feed line leading from a microwave signal amplifier. If desired, the input lead 10 may be a fine mesh for reducing its self-inductance as much as possible. The signal is fed to a strip transmission line 11 formed from a conductive strip layer 12 on a dielectric substrate 14 with a conductive grounded layer on the opposite (bottom) side of the dielectric layer 14.

In a preferred embodiment, the dielectric 14 is ceramic, for example, such as aluminum oxide ($Al_2O_3$).

The conductive strip 12 is a gold conductor adherent to the ceramic 14, and the conductive ground layer 16 is a gold coating on the bottom of the ceramic. The inductor 18, which may be formed of a line of copper or gold, is provided on the dielectric substrate 14 and connects the input end of the transmission line 11 to the conductive ground 16, thereby forming a video return circuit through the inductor 18. A diode assembly is connected at the output end of the strip transmission line 11 to place a backdiode therein in series with the line 11. Although shown as being generally box shaped, the diode assembly may also be cylindrical or any other suitable shape. A connecting lead 22 connects to a capacitor element 25. The capacitor element 25 includes a conductive layer 24 of silver or gold bonded onto the ceramic 14 and separated from the ground layer 16 by this dielectric substrate 14. The detected output is taken from lead 26 connected to the capacitor layer 24.

The diode assembly 20 and capacitor 25 provide envelope detection of an amplitude modulated microwave signal which may be fed into the output. The inductor 18, which shunts the input of the transmission line 11, acts together with the characteristic impedance and length of the strip transmission line 11 to provide impedance matching with the input coaxial cable 10.

The semiconductor element 20 may, for example, be germanium and the dot 30 (FIG. 3) may be formed of tin and arsenic. The arsenic from the dot 30 serves as the dopant to form the PN junction in the semiconductor element.

Figure 3:
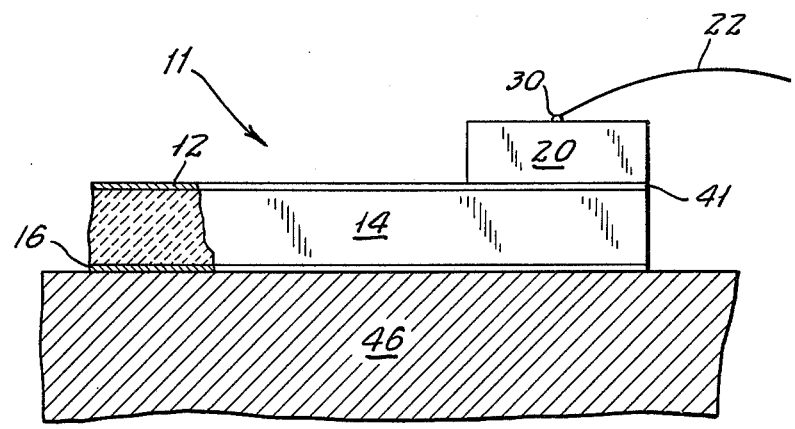
FIG. 3 is a cross-sectional view of the diode assembly and a portion of the strip transmission line of FIG. 1 or 2, shown on enlarged scale, prior to etching of the semiconductor element.

At the stage of fabrication shown in FIG. 3, the semiconductor material 20 is a relatively sturdy block having gold deposited on its bottom surface and not yet etched to form the narrow neck configuration of the backdiode. It is not until after the semiconductor material is mounted and the dot 30 is connected to a diode lead 22 in the microcircuit, that the diode is etched to form a backdiode.

In order to reduce self-inductance, the lead 22 may be a conductive mesh strip or mesh ribbon which is connected by thermo compression bonding to the dot 30. The ribbon-mesh lead 22 is formed of gold or gold-plated nickel.

Figure 4:
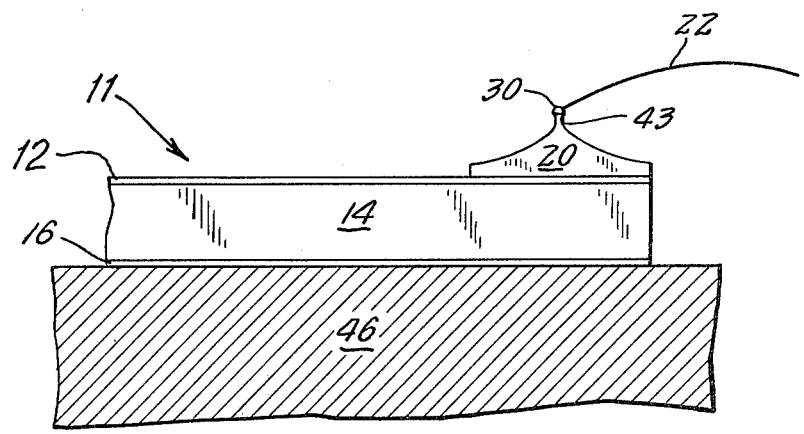
FIG. 4 is a cross-sectional view similar to FIG. 3 but showing the backdiode which has been formed by in situ etching of the semiconductor element pre-joined and integrated with other components of the desired electronic circuit assembly.

After the diode material 20 has been mounted to the upper conductive layer 12 of the strip transmission line 11 and the lead 22 has been attached to connect the diode in circuit, and the whole circuit is assembled, then the whole circuit is immersed into an electrolytic etching solution. Current is caused to flow in the electrolyte such that the germanium acts as a sacrificial anode and becomes etched away. With the exception of the semiconductor element 20, all parts of the diode assembly and the remaining components in the circuit, including the alloy dot 30, are etchant resistant. However, the semiconductor element 20 is etched away over a period of time. By monitoring the electrical characteristics of the semiconductor element during the etching process, the diode assembly can be quickly removed from the solution and rinsed when the proper amount of semiconductor material has been etched from the element 20 to form a narrow neck 43 as shown in FIG. 4. The result is the backdiode shown in FIG. 4 having a precisely dimensioned narrow necked PN junction 43 below the dot 30.

A suitable etchant is a dilute potassium hydroxide aqueous solution. During the initial stage of the etching process, which may be called the gross etching stage, a more concentrated dilute solution is used in a first bath.

Then, when the monitoring of the electrical characteristics shows that backdiode characteristics are being approached, a dilute solution of intermediate strength is used in a second bath. Finally, a weak dilute solution is used in a third bath for the polishing etch. Appropriate ranges of concentration for the three dilute solution baths are as follows:

|  | Percent of Dilute KOH Aqueous Solution: |
| --- | --- |
| Gross Etching | 10%–15% |
| Intermediate Etching | 1%–10% |
| Polishing Etching | approx. 1% |

By virtue of the fact that the mesh strip 20 is already in place when the semiconductor element is etched into its fragile narrow neck configuration 43, there is no need for further handling of the semiconductor element. Thus, the likelihood of damaging the backdiode after etching is substantially reduced, and thus a small compact backdiode assembly 20, as shown and described, can be provided integrated within a complete microwave circuit.

In effect, the microstrip line into which the backdiode was integrated prior to etching now advantageously serves as a support for carrying the completed, fragile, unpackaged backdiode.

Figure 2:
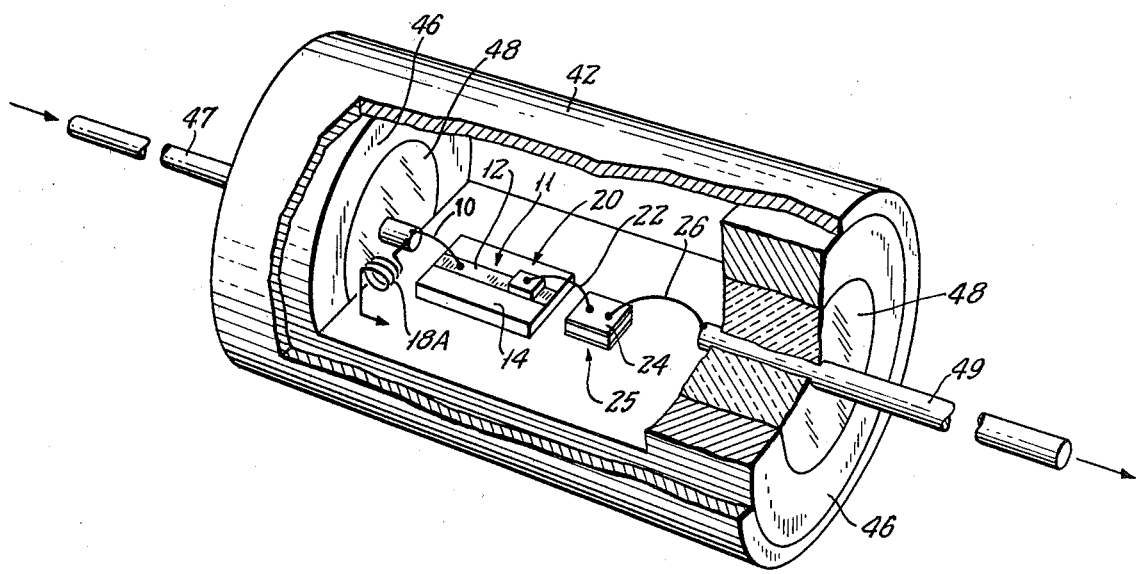
FIG. 2 is a perspective view partially cut away of a backdetector circuit similar to that of FIG. 1 but with a discrete inductor and capacitor elements, the whole circuit being located in a hermetic enclosure.

FIG. 2 shows an alternative embodiment of the backdetector circuit hermetically encapsulated in a cylindrical casing or sleeve 42. In this backdetector circuit, a discrete inductor coil 18A, rather than an integrated inductance 18, is connected to the input lead 10 or to the inner end of the input terminal line 47. As before, this discrete inductor 18A and the strip transmission line 11 provide impedance matching to the input feed line. The capacitor 25 is also a discrete element.

The backdetector circuit components are connected to and supported by a module body 46 made from a controlled-expansion metal alloy to accommodate glass-to-metal seals, for example, of the alloy called Kovar. (Kovar is a trademark for an iron-nickel-cobalt alloy which matches the thermal expansion of glass.) This module body 46 is in the shape of a cut-away cylinder which fits snugly within a Kovar sleeve 42. The input and output line 47 and 49 are each centered within a disc or plug 48 of ceramic insulating material mounted within opposite ends of the Kovar body 46. The input and output terminal leads 47 and 49, ceramic insulators 48, Kovar body 46, and sleeve 42 are sealed to provide an hermetic environment for the backdetector circuit as well as for the backdiode.

Figure 5:
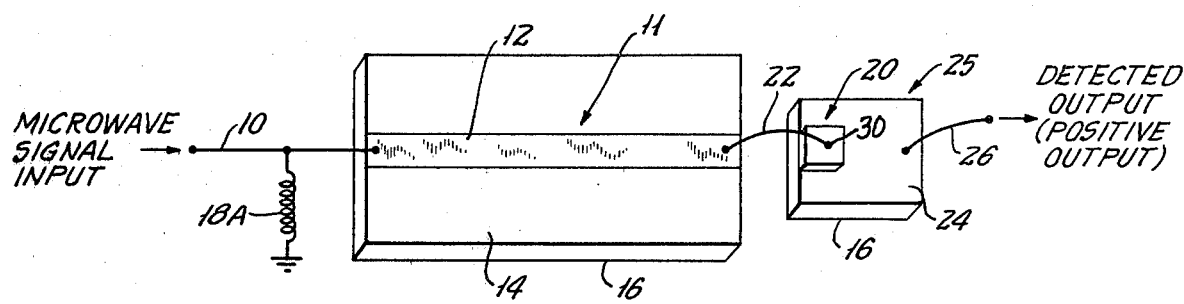
FIG. 5 is a perspective view of a microcircuit in which the backdiode is mounted to a discrete capacitor to provide a positive output.

Yet another embodiment of the microwave backdetector circuit is shown in FIG. 5. In that figure, a discrete inductor 18A and a discrete capacitor 25 are provided as in the embodiment of FIG. 2. However, in order to provide a positive output from the capacitor 25, the diode assembly 20 is mounted to the capacitor 25 rather than to the strip line 11. The method of fabricating the backdiode is the same as described above, except that the diode assembly 20 is mounted to a different circuit component, the discrete capacitor. Thus, the semiconductor element is mounted to the upper plate 24 of capacitor 25. The capacitor 25 is mounted on the ground conductor layer 16, together with the strip transmission line 14 and the inductor 18A. In other words, the whole circuit assembly is completed as shown in FIG. 5. Then, the whole circuit assembly is dipped into an electrolytic etching solution. As before, the semiconductor material 20 around the alloy dot 30 is etched away to form the narrow neck configuration of a backdiode.

Figure 6:
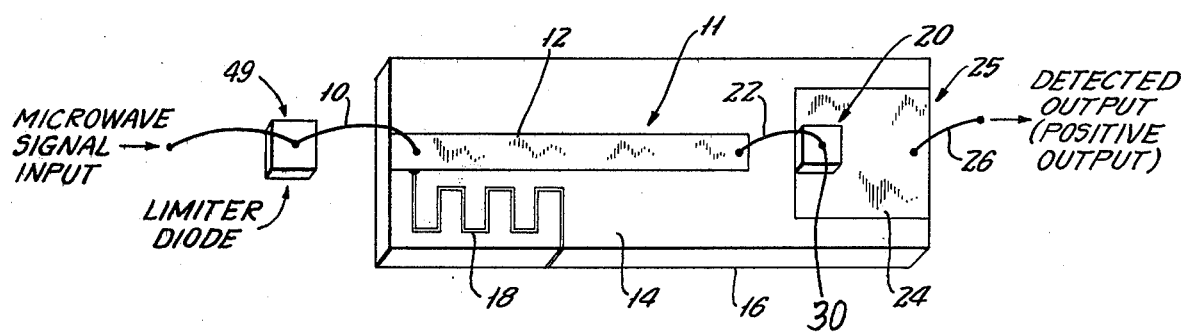
FIG. 6 is a perspective view of an integrated backdetector circuit with the backdiode mounted to the capacitor for providing a positive output and with a discrete limiter diode at the input.

Yet another microwave backdetector circuit is shown in FIG. 6. In this circuit, which is a limiter detector, an integrated inductance element 18 and integrated capacitor 25 are provided as in the embodiment in FIG. 1. However, in order to provide a positive output as in FIG. 6, the diode element 20 is mounted to the integrated capacitor prior to etching of the semiconductor element. In this limiter detector embodiment, a limiter diode 49 shunts the input to limit the signal applied to the remainder of the backdetector circuit. Such a limiter diode 49 may be a commercially available PIN diode.

It is to be understood that the embodiments of FIGS. 1, 2 and 5 may also be arranged as limiter detector by including a limiter diode shunted across the input of the microstrip line, i.e. connected from the lead 10 to the "ground" 16 or 46.

In the various circuits discussed above, the backdiode 20 is connected in series, and there is only one lead 22 connected to the dot 30. It is to be understood that the backdiode 20 may also be connected in shunt with respect to the microstrip line, in which case there are two leads connected to the dot 30.

Thus, it can be seen that in each embodiment, the unprocessed semiconductor element 20 which is a doped semiconductor chip with an alloyed metal dot making contact to the semiconductor material, and with gold deposited on the bottom is pre-joined and integrated with other circuit components, then that whole microcircuit is ready for submersion into the etchant. Subsequently, the whole microcircuit is dipped into an electrolyte etching solution, and current is caused to flow from the germanium (acting as a sacrificial anode), into the electrolyte and thence to a cathode in the electrolyte for causing the semiconductor material to become etcehed away, as shown in FIG. 4, for providing the fragile narrow neck configuration of a backdiode.

As soon as the desired narrow neck configuration 43 has been achieved, which is determined by making measurement of the electrical characteristics of the diode, the assembled circuit containing the etched backdiode is removed from the electrolyte solution and is rinsed off clean with distilled water or the like to remove all traces of the etching solution. Any further handling of the backdiode is minimized for the diode has already been securely mounted in a fully assembled circuit which can be handled with ease. Preferably, the entire backdetector circuit is then mounted within an hermetic housing as shown in FIG. 2.

Figure 7:
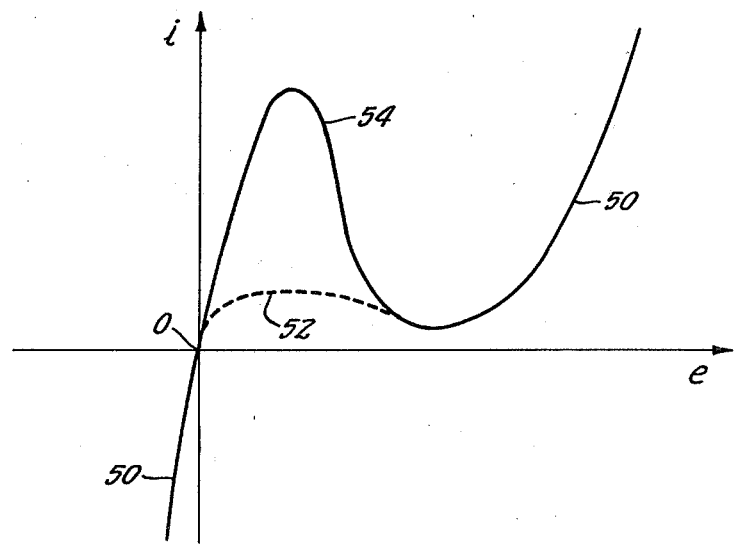
FIG. 7 is a plot of the characteristic curve of current versus applied voltage for a tunnel diode and for a backdiode.

Shown in FIG. 7 is the characteristic curve 50 for a tunnel diode. This curve 50 is the plot of current (i) through the tunnel diode as a function of the voltage (e) applied across the diode, and it includes a lobe 54. It may be noted that this curve 50 is similar to the characteristic curve shown in FIG. 1 of the Sato U.S. Pat. No. 3,150,021, discussed above. By virtue of the etching to form a very narrow neck as shown in FIG. 4, the lobe portion 54 of this characteristic curve is altered as shown by the dashed portion of the curve 52. The resultant curve 50-52-50 in the region for low voltages to the right of the zero point or origin 0 has effectively an almost horizontal shape, which is particularly advantageous for use in a microwave detector circuit. During the etching process, the operator observes the shape of the characteristic curve 50-54-50 by continuously observing the e/i characteristic on an oscilloscope. As the etching proceeds, the lobe 54 of the curve is progressively reduced in height until the desired shape 50-52-50 is obtained.

While the invention has been particularly shown and described with reference to preferred embodiments thereof, it will be understood by those skilled in the art that various changes in form and details may be made therein without departing from the spirit and scope of the invention as defined by the appended claims.

I claim:

1. The method of making a microwave microcircuit containing a backdiode comprising the steps of:
    integrating an unprocessed semiconductor diode chip with other circuit components of a microcircuit,
    causing said other circuit components of the microcircuit to be resistant to the effects of a predetermined etchant,
    providing an alloyed metal dot on the exposed upper surface of the semiconductor material of said chip,
    connecting said metal dot into the microcircuit,
    dipping the whole pre-joined and integrated microcircuit into the predetermined etchant,
    monitoring the e/i characteristics of the semiconductor diode chip during the etching,
    removing the pre-joined and integrated microcircuit from the etchant when the desired backdiode characteristics have been obtained, and
    rinsing off all traces of the etchant from the microcircuit,
    thereby completing the microwave microcircuit containing a backdiode.

2. The method of making a microwave microcircuit containing a backdiode as claimed in claim 1, including the step of:
    placing the microcircuit in an hermetically sealed housing.

3. The method of making a microwave microcircuit containing a backdiode comprising the steps of:
    integrating an unprocessed semiconductor diode chip in a microstrip line of a microcircuit,
    providing an alloyed metal dot in contact with the exposed surface of the semiconductor material of said chip,
    connecting said metal dot into the microcircuit,
    constructing said microcircuit including said microstrip line to be resistant to a predetermined etching procedure,
    subjecting the whole pre-connected microcircuit including the microstrip line to said predetermined etching procedure,
    monitoring an electrical characteristic of said semiconductor diode chip during said etching procedure, and
    stopping said etching procedure when the desired backdiode electrical characteristics are obtained,
    thereby completing the microcircuit containing the backdiode by forming the fragile backdiode after the integrating and connection steps for forming the microcircuit have been carried out.

4. The method of making a microwave microcircuit containing a backdiode as claimed in claim 3, including the step of:
    placing the completed microcircuit including said microstrip line with the integrated backdiode into an hermetically sealed housing.

5. The method of making a microwave circuit of the type comprising a strip transmission line, a backdiode and a capacitor, the method comprising:
    mounting an unprocessed semiconductor diode chip to one of said strip transmission line and said capacitor, said unprocessed diode chip including a conductive base, a semiconductor element mounted to said conductive base, a metal dot alloyed to said semiconductor element,
    connecting a lead to said dot on said semiconductor element,
    forming all of the elements, except for said semiconductor element, to be resistant to a predetermined etching solution used in a predetermined etching procedure,
    immersing said circuit including said mounted diode assembly into said etching solution and subjecting to said procedure for etching away a portion of the semiconductor element surrounding the dot to which said lead is connected,
    thereby providing a narrow neck configuration in the semiconductor element for forming a backdiode in said circuit.

6. The method of claim 5, wherein said strip transmission line, diode assembly and capacitor are subsequently hermetically sealed within an enclosure.

7. A method of making a microwave backdetector microcircuit having a frequency coverage greater than three octaves comprising the steps of:
    connecting one side of a tunnel diode formed of semiconductor material electrically in circuit with one end of a strip-line transmission line;
    connecting the other side of the tunnel diode electrically in circuit with one side of a capacitor;
    connecting an inductor electrically in circuit with the other end of said transmission line and with the other side of said capacitor for providing a return flow path for current from said other side of said capacitor;
    providing an input connection to said other end of said transmission line and an output connection to said one side of said capacitor;
    dipping the entire microcircuit as assembled by the above steps into an etchant and etching away the semiconductor material for providing a narrrow neck configuration in said semiconductor material for converting said tunnel diode into a backdiode;
    thereby making said microwave backdetector circuit having a frequency coverage greater than three octaves.

8. The method of making a microwave backdetector microcircuit having a frequency coverage greater than three octaves as claimed in claim 7, including the steps of:
    forming said strip-line transmission line as a strip of conductive material extending part of the way along one side of a dielectric substrate having a grounded conductive layer on the opposite side of said dielectric substrate;
    forming said one side of said capacitor by providing a conductive area on the same side of said substrate as said strip near one end of said strip and spaced beyond said one end of said strip;
    connecting said one side of said tunnel diode to said one end of said strip;
    connecting said other side of said tunnel diode to said conductive area;

forming said inductor as a zig-zag conductive line on said dielectric substrate and being connected between the other end of said strip and said grounded conductive layer, whereby said microcircuit is a compact integrated microcircuit including a tunnel diode; and thereafter the entire microcircuit is submerged in an etchant liquid for etching the semiconductor material for converting said tunnel diode into a backdiode.

9. The method of making a predetermined microwave microcircuit including a plurality of interconnected components connected with a backdiode comprising the steps of:

providing all of said components in etch-resistant form;

providing a tunnel diode having etchable semiconductor material therein and in which the semiconductor material is exposed;

assembling said plurality of components in the predetermined microcircuit except that said tunnel diode occupies the position intended to be occupied by the backdiode; and immersing the assembled microcircuit in an etchant liquid and etching away the semiconductor material of the tunnel diode until the tunnel diode has been converted into a backdiode having the desired fragile narrow neck configuration.

10. A microwave backdetector microcircuit having a frequency coverage greater than three octaves in a range above approximately 2 gigaHertz comprising:

a strip transmission line including a strip of conductive material extending along one side of a dielectric substrate with a grounded conductive layer on the opposite side of said dielectric substrate;

said strip having an input end and an output end;

a capacitor formed by a conductive area on said substrate spaced from said grounded conductive layer;

an input connection to the input end of said transmission line;

an inductor effectively shunted in circuit across the input of said transmission line;

a backdiode connected in said circuit including semiconductor material mounted on a conductive base terminal with a dot terminal on said semiconductor material and with a PN junction in a fragile narrow neck region of said semiconductor material near said dot terminal;

one of said backdiode terminals being connected to the output end of said transmission line;

the other of said backdiode terminals being connected to said conductive area of the capacitor;

an output connection to said conductive area of the capacitor;

wherein said narrow neck region of said backdiode has been formed by immersing the whole assembled microcircuit in an etchant liquid after assembly thereof has occurred and etching away the semiconductor material from around said narrow neck region; and wherein all of the portions of said microcircuit except for said semiconductor material are resistant to such etching.

* * * * *